US012677519B2

(12) United States Patent
Zhang et al.

(10) Patent No.: US 12,677,519 B2
(45) Date of Patent: Jul. 7, 2026

(54) INTEGRATED MICRO LED CHIP AND FABRICATION METHOD THEREFOR

(71) Applicant: Fuzhou China Prima Optoelectronics Co., Ltd., Fuzhou (CN)

(72) Inventors: Fan Zhang, Fuzhou (CN); Liangxu Wang, Fuzhou (CN); Shaojun Lin, Fuzhou (CN)

(73) Assignee: Fuzhou China Prima Optoelectronics Co., Ltd., Fuzhou (CN)

( * ) Notice: Subject to any disclaimer, the term of this patent is extended or adjusted under 35 U.S.C. 154(b) by 564 days.

(21) Appl. No.: 18/091,473

(22) Filed: Dec. 30, 2022

(65) Prior Publication Data

US 2023/0135964 A1     May 4, 2023

Related U.S. Application Data

(63) Continuation of application No. PCT/CN2021/096249, filed on May 27, 2021.

(30) Foreign Application Priority Data

May 19, 2021    (CN) .......................... 202110545174.6

(51) Int. Cl.
*H10H 29/14*          (2025.01)
*H10H 20/812*         (2025.01)
          (Continued)

(52) U.S. Cl.
CPC ........ *H10H 29/142* (2025.01); *H10H 20/812* (2025.01); *H10H 20/825* (2025.01);
          (Continued)

(58) Field of Classification Search
CPC .............. H10H 20/01; H10H 20/0363; H10H 20/8512; H10H 29/142; G02F 1/133603;
          (Continued)

(56) References Cited

U.S. PATENT DOCUMENTS

2021/0005794 A1*   1/2021   Sakong ................ H10H 20/851

FOREIGN PATENT DOCUMENTS

CN          105261691 A  *  1/2016  .......... H10H 20/857
CN          111668249 A      9/2020
          (Continued)

OTHER PUBLICATIONS

Extended European Search Report for European Patent Application No. 21940265.8 Issued on Jun. 28, 2024.
          (Continued)

*Primary Examiner* — Monica D Harrison
*Assistant Examiner* — Jacob T Nelson

(57)          ABSTRACT

An epitaxial layer in a first color and a first-color light-emitting unit of a preset shape are prepared on a substrate layer; a patterned photomask is deposited on a side, away from the epitaxial layer in the first color, of the substrate layer, and is etched to form color conversion layer location holes; because light-emitting units and the location holes are formed based on the preset shape, designed color units are separated, and mixed-color light is filtered out, and light interference is prevented; color conversion fluorescent materials are not sprayed into part of the color conversion layer location holes and color conversion fluorescent materials in the other two colors of three primary colors except the first color are sprayed into the other color conversion layer location holes.

7 Claims, 2 Drawing Sheets

(51) Int. Cl.

| | |
|---|---|
| *H10H 20/825* | (2025.01) |
| *H10H 20/84* | (2025.01) |
| *H10H 20/851* | (2025.01) |
| *H10H 20/856* | (2025.01) |
| *H10H 20/01* | (2025.01) |

(52) U.S. Cl.
CPC ........ *H10H 20/84* (2025.01); *H10H 20/8512* (2025.01); *H10H 20/8514* (2025.01); *H10H 20/856* (2025.01); *H10H 20/034* (2025.01); *H10H 20/0361* (2025.01); *H10H 20/0363* (2025.01)

(58) Field of Classification Search
CPC .... G02B 5/003; G02B 5/1857; G02B 6/0065; G02B 27/0172; G02B 27/0101; G02B 19/0061
See application file for complete search history.

(56) References Cited

FOREIGN PATENT DOCUMENTS

| | | | | | |
|---|---|---|---|---|---|
| CN | 111725251 A | * | 9/2020 | ........... | H10H 20/857 |
| CN | 112310143 A | | 2/2021 | | |
| CN | 112420901 A | * | 2/2021 | ......... | H10H 20/8515 |

OTHER PUBLICATIONS

Office Action for Chinese patent application No. 202110545174.6 Issued on Sep. 29, 2021.
International Search Report of PCT Patent Application No. PCT/CN2021/096249 issued on Jan. 26, 2022.

\* cited by examiner

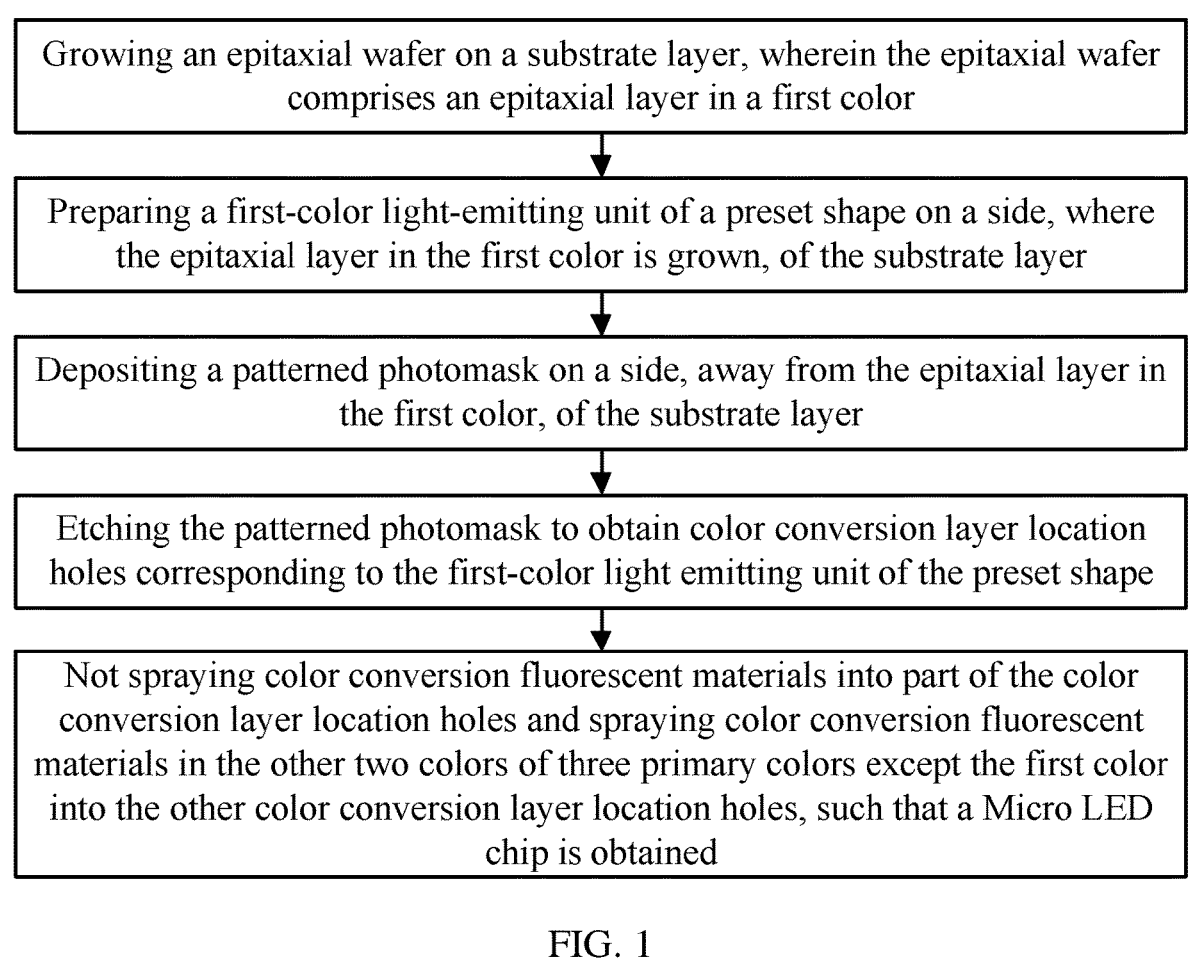

Growing an epitaxial wafer on a substrate layer, wherein the epitaxial wafer comprises an epitaxial layer in a first color

↓

Preparing a first-color light-emitting unit of a preset shape on a side, where the epitaxial layer in the first color is grown, of the substrate layer

↓

Depositing a patterned photomask on a side, away from the epitaxial layer in the first color, of the substrate layer

↓

Etching the patterned photomask to obtain color conversion layer location holes corresponding to the first-color light emitting unit of the preset shape

↓

Not spraying color conversion fluorescent materials into part of the color conversion layer location holes and spraying color conversion fluorescent materials in the other two colors of three primary colors except the first color into the other color conversion layer location holes, such that a Micro LED chip is obtained

FIG. 1

INTEGRATED MICRO LED CHIP AND FABRICATION METHOD THEREFOR

CROSS REFERENCE TO RELATED APPLICATIONS

The present application is a Continuation application of PCT Application No. PCT/CN2021/096249 filed on May 27, 2021, which claims the benefit of Chinese Patent Application No. 202110545174.6 filed on May 19, 2021. All the above are hereby incorporated by reference in their entirety.

TECHNICAL FIELD

The invention relates to the field of LED fabrication, in particular to an integrated Micro LED chip and a fabrication method therefor.

DESCRIPTION OF RELATED ART

At present, in the technical field of international display, the Micro LED fabrication technique has the greatest development potential and market potential. There are two types of circuits for realizing Micro LED full-color display. According to the former, RGB three-color chips are combined through mass transfer to form a screen. However, the scheme of mass transfer has many limitations and bottlenecks in the aspect of transfer speed. According to the latter, light-emitting units are integrated in one chip screen through the semiconductor process.

The key to realizing full-color display of integrated Micro LED chips is how to integrate RGB three-color light sources on one chip. At present, the scheme of simultaneously growing RGB three-color light-emitting layers on an epitaxial layer and the scheme of simultaneously growing a green light-emitting layer and a blue light-emitting layer on an epitaxial layer are adopted. However, all these schemes have the problems of difficult epitaxial growth, low yield, low brightness, and the like.

BRIEF SUMMARY OF THE INVENTION

The technical issue to be settled by the invention is to provide an integrated Micro LED chip and a fabrication method therefor to reduce the epitaxial growth process.

One technical solution adopted by the invention to settle the above technical issue is as follows:

A fabrication method for an integrated Micro LED chip comprises the following steps:

Growing an epitaxial wafer on a substrate layer, wherein the epitaxial wafer comprises an epitaxial layer in a first color;

Preparing a first-color light-emitting unit of a preset shape on a side, where the epitaxial layer in the first color is grown, of the substrate layer;

Depositing a patterned photomask on a side, away from the epitaxial layer in the first color, of the substrate layer;

Etching the patterned photomask to obtain color conversion layer location holes corresponding to the first-color light emitting unit of the preset shape; and Not spraying color conversion fluorescent materials into part of the color conversion layer location holes and spraying color conversion fluorescent materials in the other two colors of three primary colors except the first color into the other color conversion layer location holes, such that a Micro LED chip is obtained.

The other technical solution adopted by the invention to settle the above technical issue is as follows:

An integrated Micro LED chip comprises a drive module, a blue pixel unit, a red pixel unit and a green pixel unit;

The blue pixel unit sequentially comprises a blue epitaxial layer, a substrate layer and a photomask from an end close to the drive module to an end away from the drive module;

The green pixel unit sequentially comprises the blue epitaxial layer, the substrate layer, a green color conversion fluorescent material and the photomask from the end close to the drive module to the end away from the drive module;

The red pixel unit sequentially comprises the blue epitaxial layer, the substrate layer, a red color conversion fluorescent material and the photomask from the end close to the drive module to the end away from the drive module;

The blue pixel unit, the red pixel unit and the green pixel unit share the substrate layer and the photomask.

The invention has the following beneficial effects: an epitaxial layer in a first color is grown on a substrate layer, and a first-color light-emitting unit of a preset shape is prepared; a patterned photomask is deposited on a side, away from the epitaxial layer in the first color, of the substrate layer, and is etched to form color conversion layer location holes, and because light-emitting units and the location holes are formed based on the preset shape, each designed color unit can be separated through the light-emitting units and the location holes, and mixed-color light is automatically filtered out, and light interference is prevented; color conversion fluorescent materials are not sprayed into part of the color conversion layer location holes and color conversion fluorescent materials in the other two colors of three primary colors except the first color are sprayed into the other color conversion layer location holes to obtain a blue pixel unit, a red pixel unit and a green pixel unit, such that full colors can be realized easily without affecting the electrical properties of the LED light-emitting units. Thus, by adoption of the single-color epitaxial technique, a full-color chip with three colors can be formed by means of only one epitaxial color, the process of stripping a substrate layer to prepare epitaxial quantum wells with multiple wavelengths is not needed, the complexity of the epitaxial structure is reduced, the integration of a large number of pixels can be realized without mass transfer, and the production cost is reduced.

BRIEF DESCRIPTION OF THE SEVERAL VIEWS OF DRAWINGS

FIG. 1 is a flow diagram of the steps of a fabrication method for an integrated Micro LED chip according to one embodiment of the invention;

Figure 2:
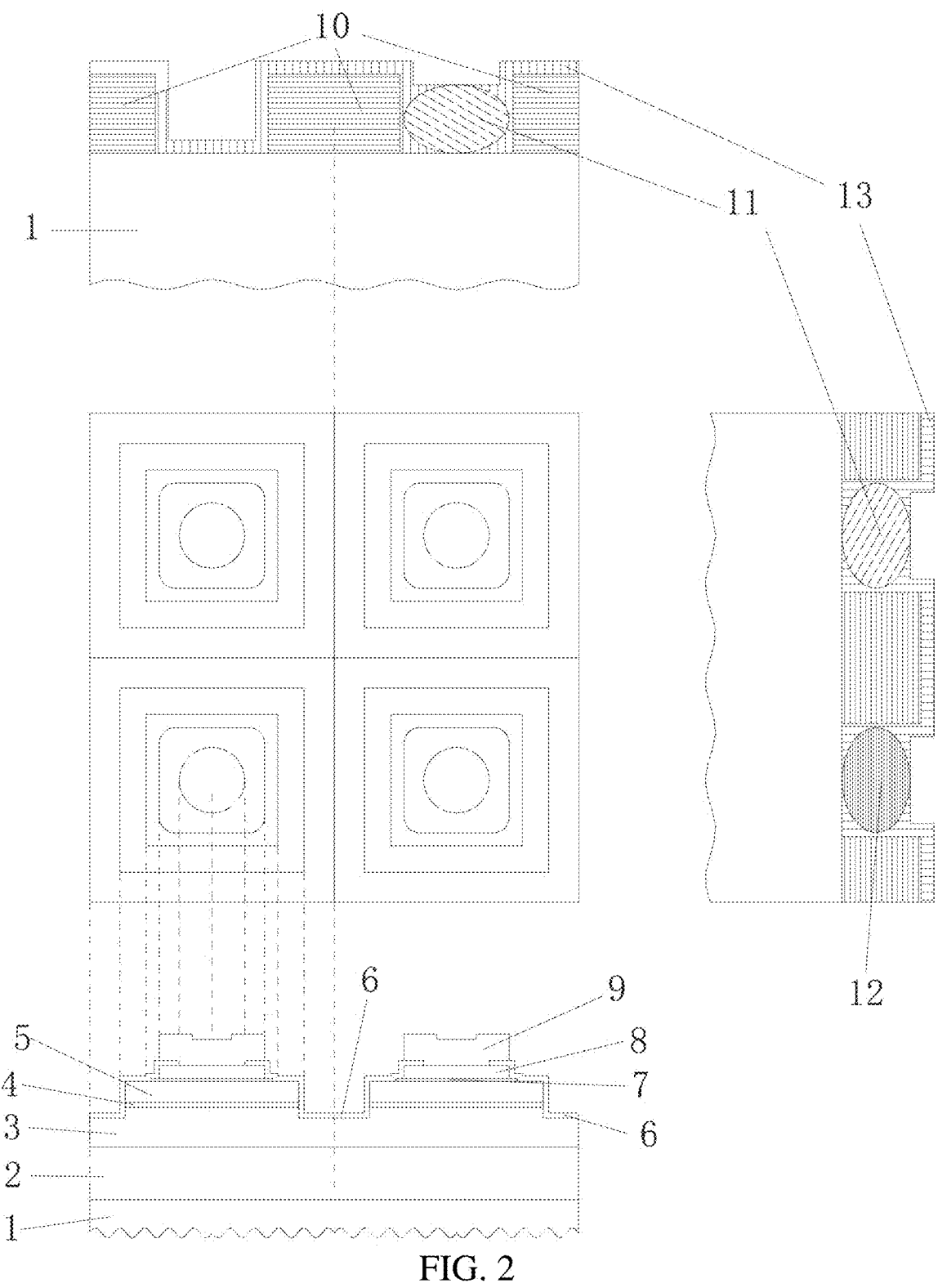
FIG. 2 is a structural diagram of an integrated Micro LED chip according to one embodiment of the invention.

REFERENCE SIGNS 1, substrate layer; 2, GaN buffer layer; 3, N-type GaN layer; 4, blue quantum well layer; 5, P-type GaN layer; 6, insulating and passivating composite layer; 7, metal oxide current spreading layer; 8, metal current spreading layer and etching sacrificial layer; 9, current injection and welding layer; 10, patterned photomask; 11, red color conversion fluorescent material; 12, green color conversion fluorescent material; 13, surface protection layer.

DETAILED DESCRIPTION OF THE INVENTION

The technical contents, purposes and effects of the invention will be described in detail below in conjunction with embodiments and accompanying drawings.

Referring to FIG. 1, one embodiment of the invention provides a fabrication method for an integrated Micro LED, comprising the following steps:

Growing an epitaxial wafer on a substrate layer, wherein the epitaxial wafer comprises an epitaxial layer in a first color;

Preparing a first-color light-emitting unit of a preset shape on a side, where the epitaxial layer in the first color is grown, of the substrate layer;

Depositing a patterned photomask on a side, away from the epitaxial layer in the first color, of the substrate layer;

Etching the patterned photomask to obtain color conversion layer location holes corresponding to the first-color light emitting unit of the preset shape; and Not spraying color conversion fluorescent materials into part of the color conversion layer location holes, and spraying color conversion fluorescent materials in the other two colors of three primary colors except the first color into the other color conversion layer location holes, such that a Micro LED chip is obtained.

From the above description, the invention has the following beneficial effects: an epitaxial layer in a first color is grown on a substrate layer, and a first-color light-emitting unit of a preset shape is prepared; a patterned photomask is deposited on a side, away from the epitaxial layer in the first color, of the substrate layer, and is etched to form color conversion layer location holes, and because light-emitting units and the location holes are formed based on the preset shape, each designed color unit can be separated through the light-emitting units and the location holes, and mixed-color light is automatically filtered out, and light interference is prevented; color conversion fluorescent materials are not sprayed into part of the color conversion layer location holes and color conversion fluorescent materials in the other two colors of three primary colors except the first color are sprayed into the other color conversion layer location holes to obtain a blue pixel unit, a red pixel unit and a green pixel unit, such that full colors can be realized easily without affecting the electrical properties of the LED light-emitting units. In this way, a full-color chip with three colors can be formed by means of only one epitaxial color, the process of stripping a substrate layer to prepare epitaxial quantum wells with multiple wavelengths is not needed, the complexity of the epitaxial structure is reduced, the integration of a large number of pixels and full-color display can be realized without mass transfer, and the production cost is reduced.

Further, preparing a first-color light-emitting unit of a preset shape on a side, where the epitaxial layer in the first color is grown, of the substrate layer comprises:

Sequentially growing a PN junction, a metal oxide current spreading layer, a metal current spreading layer and etching sacrificial layer, and a current injection and welding layer on the side, where the epitaxial layer in the first color is grown, of the substrate layer from an end close to the substrate layer to an end away from the substrate layer;

Covering the metal current spreading layer and etching sacrificial layer by an insulating and passivating composite layer, and covering the PN junction and the metal oxide current spreading layer; and Setting a region on the insulating and passivating composite layer located above the metal current spreading layer and etching sacrificial layer, and connecting the metal current spreading layer and etching sacrificial layer with the current injection and welding layer through the region.

From the above description, the epitaxial wafer is protected by the insulating and passivating composite layer, and through the metal oxide current spreading layer and the metal current spreading layer, the environmental adaptability, current tolerance and temperature tolerance of the Micro LED can be remarkably improved, and the brightness of light emitted by the chip can be improved.

Further, the PN junction sequentially comprises an N-type GaN layer, a quantum well layer and a P-type GaN layer from the end close to the substrate layer to the end away from the substrate layer.

From the above description, the PN junction is unidirectionally conductive, such that light in the first color can be emitted to the substrate layer through the quantum well layer.

Further, depositing a patterned photomask on a side, away from the epitaxial layer in the first color, of the substrate layer comprises:

Depositing an SiO—TiO alternate composite film on the side, away from the epitaxial layer in the first color, of the substrate layer; and Forming a distributed Bragg reflection effect on the film according to the preset shape to obtain the patterned photomask.

From the above description, the photomask is patterned according to the preset shape, such that each designed color unit can be separated, and the photomask can automatically filter out mixed-color light and can prevent light interference.

Further, etching the patterned photomask to obtain color conversion layer location holes corresponding to the first-color light emitting unit of the preset shape comprises:

Etching the surface of the patterned photomask according to the shape of the first-color light-emitting unit to obtain the color conversion layer location holes, wherein the color conversion layer location holes penetrate through the photomask to reach the substrate layer;

Wherein, the interior of the color conversion layer location holes is pervious to light, and the exterior of the color conversion layer location holes is not pervious to light.

From the above description, the color conversion layer location holes penetrate through the photomask, such that even if fluorescent materials overflow out of via-holes, they are still located on the photomask; the exterior of the color conversion layer location hole is not pervious to light and will not be exposed to photons emitted by the epitaxial layer, such that light interference can be prevented, the requirement for spraying precision of the color conversion fluorescent materials can be lowered, and the yield of chips can be increased.

Further, spraying color conversion fluorescent materials in the other color conversion layer location holes comprises:

Injecting the color conversion fluorescent materials in the other color conversion layer location holes through nano-inkjet.

From the above description, the injection rate of the color conversion fluorescent materials can be increased through nano-inkjet; and the photomask and the via-holes are prepared in advance, such that the precision requirement during inkjet can be lowered, thus greatly improving the yield and display effect of chips.

Further, the first color is blue.

From the above description, by setting the first color as blue, the light-emitting efficiency and stability are high.

Further, four color conversion layer location holes are formed and are arranged in a 2*2 manner;

The step of not spraying color conversion fluorescent materials into part of the color conversion layer location holes and spraying color conversion fluorescent materials in the other two colors of three primary colors except the first color into the other color conversion layer location holes comprises:

Not spraying color conversion fluorescent materials into one of the color conversion layer location holes, spraying a red conversion fluorescent material into one or two of the color conversion layer location holes, and spraying a green conversion fluorescent material in the remaining color conversion layer location holes;

Wherein, the red conversion fluorescent material is mainly $K_2TiF_6:Mn^{4+}$, and the green conversion fluorescent material is mainly $CsPb(Br/I)_3$.

From the above description, the ratio of the red conversion fluorescent material to the green conversion fluorescent material is 1:2 or 2:1, and the excitation efficiency of the red and green conversion fluorescent materials can be adjusted to change the influence of the overall color gamut of a display screen, so as to realize full-color display.

Further, the fabrication method further comprises:

Controlling the light intensity of the blue light-emitting unit in different regions according to a current input by a drive module.

From the above description, the degree of color display of different pixel units can be changed by adjusting the current input by the drive module, so as to realize full-color display.

Referring to FIG. 2, another embodiment of the invention provides an integrated Micro LED chip, comprising a drive module, a blue pixel unit, a red pixel unit and a green pixel unit;

The blue pixel unit sequentially comprises a blue epitaxial layer, a substrate layer and a photomask from an end close to the drive module to an end away from the drive module;

The green pixel unit sequentially comprises the blue epitaxial layer, the substrate layer, a green color conversion fluorescent material and the photomask from the end close to the drive module to the end away from the drive module;

The red pixel unit sequentially comprises the blue epitaxial layer, the substrate layer, a red color conversion fluorescent material and the photomask from the end close to the drive module to the end away from the drive module;

The blue pixel unit, the red pixel unit and the green pixel unit share the substrate layer and the photomask.

From the above description, an epitaxial layer in a first color is grown on a substrate layer, and a first-color light-emitting unit of a preset shape is prepared; a patterned photomask is deposited on a side, away from the epitaxial layer in the first color, of the substrate layer, and is etched to form color conversion layer location holes, and because light-emitting units and the location holes are formed based on the preset shape, each designed color unit can be separated through the light-emitting units and the location holes, and mixed-color light is automatically filtered out, and light interference is prevented; color conversion fluorescent materials are not sprayed into part of the color conversion layer location holes and color conversion fluorescent materials in the other two colors of three primary colors except the first color are sprayed into the other color conversion layer location holes to obtain a blue pixel unit, a red pixel unit and a green pixel unit, such that full colors can be realized easily without affecting the electrical properties of the LED light-emitting units. Thus, by adoption of the single-color epitaxial technique, a full-color chip with three colors can be formed by means of only one epitaxial color, the process of stripping a substrate layer to prepare epitaxial quantum wells with multiple wavelengths is not needed, the complexity of the epitaxial structure is reduced, the integration of a large number of pixels can be realized without mass transfer, and the production cost is reduced.

The integrated Micro LED chip and the fabrication method therefor are suitable for preparing various full-color Micro LED chips, and can realize a high resolution without mass transfer. The integrated Micro LED chip and the fabrication method therefor will be explain below in conjunction with specific embodiments.

Embodiment 1

Referring to FIG. 1, a fabrication method for an integrated Micro LED chip comprises the following steps;

S1: growing an epitaxial wafer on a substrate layer, wherein the epitaxial wafer comprises an epitaxial layer in a first color;

Wherein, the first color is blue;

In an optional embodiment, the substrate layer 1 is a sapphire substrate (Al2O3);

Specifically, in this embodiment, the thickness of the substrate layer is 650 μm, a GaN buffer layer 2 with a thickness of 2-4 μm is disposed at the end, where the epitaxial wafer is grown, of the substrate layer, a blue LED epitaxial wafer is prepared from a material which is mainly made of GaN, and the wavelength of the epitaxial wafer is 400-480 nm;

S2: preparing a first-color light-emitting unit of a preset shape on a side, where the epitaxial layer in the first color is grown, of the substrate layer;

Wherein, a PN junction, a metal oxide current spreading layer, a metal current spreading layer and etching sacrificial layer, and a current injection and welding layer are sequentially grown on the side, where the epitaxial layer in the first color is grown, of the substrate layer from an end close to the substrate layer to an end away from the substrate layer;

The metal current spreading layer and etching sacrificial layer is covered by an insulating and passivating composite layer, and the PN junction and the metal oxide current spreading layer are covered;

A region is set on the insulating and passivating composite layer located above the metal current spreading layer and etching sacrificial layer, and the metal current spreading layer and etching sacrificial layer are connected with the current injection and welding layer through the region;

Wherein, the PN junction sequentially comprises an N-type GaN layer, a quantum well layer and a P-type GaN layer from the end close to the substrate layer to the end away from the substrate layer.

Specifically, referring to FIG. 2, the thickness of the N-type GaN layer 3 is 1-3 µm, the thickness of the quantum well layer 4 is 0.05-1 µm, and the thickness of the P-type GaN layer is 0.5-2 µm;

Specifically, referring to FIG. 2, through the insulating and passivating composite layer 6 (thickness: 0.1-1 µm), the metal oxide current spreading layer (thickness: 0.03-0.5 µm), the metal current spreading layer and etching sacrificial layer 8 (thickness: 0.3-2 µm) and the current injection and welding layer 9 (thickness: 0.5-4 µm), the environmental adaptability, current tolerance and temperature tolerance of the Micro LED chip can be remarkably improved; and a surface protection layer 13 (thickness: 0.1-2 µm) covering color conversion fluorescent materials and a photomask has a good cladding capacity and good acid, alkali and moisture resistance;

S3: depositing a patterned photomask on a side, away from the epitaxial layer in the first color, of the substrate layer;

Wherein, a SiO—TiO alternate composite film is deposited on the side away from the epitaxial layer in the first color, of the substrate layer;

A distributed Bragg reflection effect is formed on the film according to the preset shape to obtain the patterned photomask.

Specifically, the distributed Bragg reflection effect is formed on the film according to the preset shape to obtain the patterned photomask 10, such that the patterned photomask can be etched later based on the preset shape;

S4: etching the patterned photomask to obtain color conversion layer location holes corresponding to the first-color light emitting unit of the preset shape;

Wherein, the surface of the patterned photomask is etched according to the shape of the first-color light-emitting unit to obtain the color conversion layer location holes, wherein the color conversion layer location holes penetrate through the photomask to reach the substrate layer;

The interior of the color conversion layer location holes is pervious to light, and the exterior of the color conversion layer location holes is not pervious to light;

Specifically, the color conversion layer location holes obtained by etching the surface of the patterned photomask is etched according to the shape of the first-color light-emitting unit correspond to the shape of the first-color light emitting unit, such that light interference between adjacent light-emitting units can be reduced through the photomask and the location holes; and through the structure of the patterned photomask in this embodiment, the spraying precision requirements of fluorescent materials can be reduced, and the desired precision requirement can be met more easily when the fluorescent materials are sprayed, thus greatly improving the yield and display effect of chips;

In this embodiment, the color conversion layer location holes need to penetrate through the photomask to reach the substrate layer, such that the substrate should be have certain thickness and can be used for etching buffer, and thus, the chip can still be used normally even if the substrate layer is etched during the etching process;

S5: not spraying color conversion fluorescent materials into part of the color conversion layer location holes, and spraying color conversion fluorescent materials in the other two colors of three primary colors except the first color are sprayed into the other color conversion layer location holes, such that a Micro LED chip is obtained;

Wherein, spraying the color conversion fluorescent materials into the other color conversion layer location holes comprises:

Injecting the color conversion fluorescent materials in the other color conversion layer location holes through nano-inkjet.

Specifically, the color conversion fluorescent materials comprise a red color conversion fluorescent material 11 and a green color conversion fluorescent material 12, wherein the color conversion fluorescent material 11 is mainly made of $K_2TiF_6$:$Mn^{4+}$, the green conversion fluorescent material is mainly $CsPb(Br/I)_3$, and the thickness of the sprayed color conversion fluorescent materials is 1-10 µm, so the size of each light-emitting unit is 1-30 µm;

Wherein, the fabrication method further comprises:

Controlling the light intensity of the blue light-emitting unit in different regions according to a current input by a drive module;

Specifically, the current injection and welding layer is combined with the drive module, and the drive module is used for injecting a current; and in this embodiment, when the current is injected into quantum wells in the epitaxial layer, the quantum wells emit blue light, which penetrates through the epitaxial layer and the substrate layer to reach a display view surface;

Wherein, the SiO—TiO alternate composite film, the film-based location holes and the color conversion fluorescent materials in the location holes are located on the display view surface;

Light cannot penetrate through the patterned photomask, such that light interference is prevented; and blue light is directly emitted from the location holes without fluorescent materials of the patterned photomask, red light is emitted from the location holes with the red fluorescent material, and green light is emitted from the location holes with the green fluorescent material, such that a full-color chip with three colors is formed by means of one epitaxial color;

In other equivalent embodiments, when the first color is red, blue fluorescent powder and green fluorescent powder are sprayed into the location holes respectively; similarly, when the first color is green, red fluorescent powder and blue fluorescent powder are sprayed into the location holes respectively;

Based on the above solution, RGB display is realized, the current input to the epitaxial layer is controlled by means of the drive module, and the light intensity of the RGB three-color emitting units can be controlled, such that full-gamut color display effect is realized by mixing different light intensities of the RGB three-color emitting units.

Embodiment 2

The difference of this embodiment from Embodiment 1 lies in how to spray the color conversion fluorescent materials.

Specifically, four color conversion layer location holes are formed and are arranged in a 2*2 manner;

The step of not spraying color conversion fluorescent materials into part of the color conversion layer location holes and spraying color conversion fluorescent materials in the other two colors of three primary colors except the first color into the other color conversion layer location holes comprises:

Not spraying color conversion fluorescent materials into one of the color conversion layer location holes, spraying a red conversion fluorescent material into one or two of the color conversion layer location holes, and spraying a green conversion fluorescent material in the remaining color conversion layer location holes;

In this embodiment, when light-emitting unit on the front side of the epitaxial wafer is manufactured, a 2*2 matrix is reserved on the layout; a blue fluorescent material is sprayed into one of the location holes in the back side of the substrate, a red fluorescent material is sprayed into one of the location holes, and a green fluorescent material is sprayed into two of the location holes; or, the blue fluorescent material is sprayed into one of the location holes in the back side of the substrate, the red fluorescent material is sprayed into two of the location holes, and the green fluorescent material is sprayed into one of the location holes; wherein, if the first color is blue, blue fluorescent material is sprayed into one of the location holes in the back side of the substrate, a red fluorescent materials are not sprayed into location holes in the blue color in the back side of the substrate, and the ratio of the red fluorescent material to the green fluorescent material is 1:2 or 2:1, and the excitation efficiency of the red and green conversion fluorescent materials can be adjusted to change the influence of the overall color gamut of a display screen, so as to realize full-color display.

Embodiment 3

Embodiment 3 of the invention provides a fabrication method for an integrated Micro LED chip, comprising the following steps;

Step 1: growing a blue GaN epitaxial material, wherein the wavelength of an epitaxial wafer ranges from 400 nm to 475 nm, and a substrate is a sapphire substrate ($Al_2O_3$);

Step 2: etching a front side of the prepared epitaxial wafer according to a 2*2 matrix to remove part of P-type GaN to expose N-type GaN below;

Step 3: preparing an oxide current spreading layer, wherein in this embodiment, the oxide current spreading layer is prepared from an ITO material;

Step 4: preparing a metal current spreading layer and etching sacrificial layer, wherein in this embodiment, the metal current spreading layer and etching sacrificial layer is prepared from a TiPtTi alloy metal;

Step 5: preparing an insulating and passivating composite layer, wherein in this embodiment, the insulating passivation composite layer is a $SiO_2$ and $Al_2O_3$ composite structure, a lower insulating layer and buffer layer is prepared from $SiO_2$, and an upper passivating layer is prepared from $Al_2O_3$;

Step 6: preparing a current injection and welding layer, wherein in this embodiment, the current injection and welding layer is a Cr—Pt—Au alloy structure;

Step 7: grinding the wafer through a grinding material such as a diamond grinding wheel, diamond grinding liquid, an aluminum oxide polishing agent until the thickness of the wafer reaches 300-400 μm;

Step 8: turning the wafer, and depositing a SiO—TiO alternate composite light-shield layer on one side of the sapphire substrate ($Al_2O_3$) of the wafer;

Step 9: forming fluorescent material location holes in positions, corresponding to the 2*2 matrix, the SiO—TiO alternate composite light-shield layer prepared in Step 8, wherein the interior of the holes is pervious to light, and the exterior of the holes, such that even if fluorescent materials overflow out of holes, the stability of the color of light emitted by light-emitting units will not be affected;

Step 10: spraying fluorescent materials into the location holes formed in Step 9, wherein in the 2*2 matrix, fluorescent materials are not sprayed into the upper left hole, a red conversion material K2TiF6:Mn4+ is sprayed into the upper right hole, and a green conversion material CsPb(Br/I)3 is sprayed into the lower left hole and the lower right hole; and Step 11: depositing $Al_2O_3$ on the surface of the structure prepared in Step 10 through atomic layer deposition to form a surface protection layer.

Embodiment 4

Embodiment 4 of the invention provides a fabrication method for an integrated Micro LED chip, comprising the following steps:

Step 1: growing a blue GaN epitaxial material, wherein the wavelength of an epitaxial wafer ranges from 400 nm to 475 nm, and a substrate is a sapphire substrate (Al2O3);

Step 2: etching a front side of the prepared epitaxial wafer to remove part of P-type GaN to expose N-type GaN below;

Step 3: preparing an oxide current spreading layer, wherein in this embodiment, the oxide current spreading layer is prepared from a molybdenum sulfide material;

Step 4: preparing a metal current spreading layer and etching sacrificial layer, wherein in this embodiment, the metal current spreading layer and etching sacrificial layer is prepared from a CrAlTiPtTi alloy metal;

Step 5: preparing an insulating and passivating composite layer, wherein in this embodiment, the insulating passivation composite layer is a Si3N4 and Al2O3 composite structure, a lower insulating layer and buffer layer is prepared from Si3N4, and an upper passivating layer is prepared from $Al_2O_3$;

Step 6: preparing a current injection and welding layer, wherein in this embodiment, the current injection and welding layer is a Ti—Pt—Ru—Au alloy structure;

Step 7: grinding the wafer through a grinding material such as a diamond grinding wheel, diamond grinding liquid, an aluminum oxide polishing agent until the thickness of the wafer reaches 300-400 μm;

Step 8: turning the wafer, and depositing a SiO—HfO alternate composite light-shield layer on one side of the sapphire substrate ($Al_2O_3$) of the wafer;

Step 9: forming fluorescent material location holes in positions, corresponding to the 2*2 matrix, the SiO—HfO alternate composite light-shield layer prepared in Step 8, wherein the interior of the holes is pervious to light, and the exterior of the holes, such that even if fluorescent materials overflow out of holes, the stability of the color of light emitted by light-emitting units will not be affected;

Step 10: spraying fluorescent materials into the location holes formed in Step 9, wherein in the 2*2 matrix, fluorescent materials are not sprayed into the upper left hole, a red conversion material K2TiF6:Mn4+ is sprayed into the upper right hole, and a green conversion material CsPb(Br/I)3 is sprayed into the lower left hole and the lower right hole; and Step 11: depositing Ta2O5 on the surface of the structure prepared in Step 10 through atomic layer deposition to form a surface protection layer.

Embodiment 5

Referring to FIG. 2, this embodiment provides an integrated Micro LED chip, comprising a drive module, a blue pixel unit, a red pixel unit and a green pixel unit, wherein:

The blue pixel unit sequentially comprises a blue epitaxial layer, a substrate layer and a photomask from an end close to the drive module to an end away from the drive module;

The green pixel unit sequentially comprises the blue epitaxial layer, the substrate layer, a green color conversion fluorescent material and the photomask from the end close to the drive module to the end away from the drive module;

The red pixel unit sequentially comprises the blue epitaxial layer, the substrate layer, a red color conversion fluorescent material and the photomask from the end close to the drive module to the end away from the drive module;

The blue pixel unit, the red pixel unit and the green pixel unit share the substrate layer and the photomask.

According to the integrated Micro LED chip and the fabrication method therefor, an epitaxial layer in a first color is grown on a substrate layer, and a first-color light-emitting unit of a preset shape is prepared; a patterned photomask is deposited on a side, away from the epitaxial layer in the first color, of the substrate layer, and is etched to form color conversion layer location holes, and because light-emitting units and the location holes are formed based on the preset shape, each designed color unit can be separated through the light-emitting units and the location holes, and mixed-color light is automatically filtered out, and light interference is prevented; the interior of the location holes is pervious to light, and the exterior of the location holes is not pervious to light, the spraying precision requirement of color conversion fluorescent materials can be reduced according to the structure of the photomask and the location holes, and the yield of chips is greatly improved; color conversion fluorescent materials are not sprayed into part of the color conversion layer location holes and color conversion fluorescent materials in the other two colors of three primary colors except the first color are sprayed into the other color conversion layer location holes to obtain a blue pixel unit, a red pixel unit and a green pixel unit, such that full colors can be realized easily without affecting the electrical properties of the LED light-emitting units; the structure of the Micro LED chip is formed by two metal layers, the first metal layer is used for spreading and etching buffer, and the second metal layer is used for current injection and welding, so compared with Micro LED chips formed by one metal layer, the current tolerance and high temperature tolerance of each light-emitting unit are improved; fluorescent materials formed by ink-jet are wrapped and protected by a surface protection film, such that the acid and alkali resistance of the light-emitting units are further guaranteed; thus, by adoption of the single-color epitaxial technique, a full-color chip with three colors can be formed by means of only one epitaxial color, the process of stripping a substrate layer to prepare epitaxial quantum wells with multiple wavelengths is not needed, the complexity of the epitaxial structure is reduced, the integration of a large number of pixels can be realized without mass transfer, and the production cost is reduced.

The above description is merely used to explain the embodiments of the invention, and is not intended to limit the patent scope of the invention. All equivalent transformations made according to the contents of the specification and the drawings, or direct or indirect applications to related technical field should also fall within the patent protection scope of the invention.

What is claimed is:

1. A fabrication method of an integrated Micro LED chip, comprising:

growing an epitaxial wafer on a substrate layer, wherein the epitaxial wafer comprises an epitaxial layer in a first color;

preparing a first-color light-emitting unit of a preset shape on a side, where the epitaxial layer in the first color is grown, of the substrate layer;

depositing a patterned photomask on a side, away from the epitaxial layer in the first color, of the substrate layer;

etching the patterned photomask to obtain color conversion layer location holes corresponding to the first-color light emitting unit of the preset shape; and not spraying color conversion fluorescent materials into part of the color conversion layer location holes and spraying color conversion fluorescent materials in the other two colors of three primary colors except the first color into the other color conversion layer location holes, such that a Micro LED chip is obtained;

wherein the depositing of a patterned photomask on a side, away from the epitaxial layer in the first color, of the substrate layer comprises:

depositing an $SiO_2$—$TiO_2$ alternate composite film on the side, away from the epitaxial layer in the first color, of the substrate layer; and forming a distributed Bragg reflector on the film according to the preset shape to obtain the patterned photomask;

the etching of the patterned photomask to obtain color conversion layer location holes corresponding to the first-color light emitting unit of the preset shape comprises:

etching a surface of the patterned photomask according to the shape of the first-color light-emitting unit to obtain the color conversion layer location holes, wherein the color conversion layer location holes penetrate through the photomask to reach the substrate layer;

wherein, an interior of the color conversion layer location holes is pervious to light, and an exterior of the color conversion layer location holes within the surface of the patterned photomask is non-transparent.

2. The fabrication method of an integrated Micro LED chip according to claim 1, wherein preparing a first-color light-emitting unit of a preset shape on a side, where the epitaxial layer in the first color is grown, of the substrate layer comprises:

sequentially growing a PN junction, a metal oxide current spreading layer, a metal current spreading layer and etching sacrificial layer, and a current injection and welding layer on the side, where the epitaxial layer in the first color is grown, of the substrate layer from an end close to the substrate layer to an end away from the substrate layer;

covering the metal current spreading layer and etching sacrificial layer by an insulating and passivating composite layer, and covering the PN junction and the metal oxide current spreading layer; and setting a region on the insulating and passivating composite layer located above the metal current spreading layer and etching sacrificial layer, and connecting the metal current spreading layer and etching sacrificial layer with the current injection and welding layer through the region.

3. The fabrication method of an integrated Micro LED chip according to claim 2, wherein the PN junction sequentially comprises an N-type GaN layer, a quantum well layer and a P-type GaN layer from the end close to the substrate layer to the end away from the substrate layer.

4. The fabrication method of an integrated Micro LED chip according to claim 1, wherein spraying color conversion fluorescent materials in the other color conversion layer location holes comprises:

injecting the color conversion fluorescent materials in the other color conversion layer location holes through nano-inkjet.

5. The fabrication method of an integrated Micro LED chip according to claim 1, wherein the first color is blue.

6. The fabrication method of an integrated Micro LED chip according to claim 5, wherein four color conversion layer location holes are formed and are arranged in a 2*2 manner;

the step of not spraying color conversion fluorescent materials into part of the color conversion layer location holes and spraying color conversion fluorescent materials in the other two colors of three primary colors except the first color into the other color conversion layer location holes comprises:

not spraying color conversion fluorescent materials into one of the color conversion layer location holes, spraying a red conversion fluorescent material into one or two of the color conversion layer location holes, and spraying a green conversion fluorescent material in the remaining color conversion layer location holes;

wherein, the red conversion fluorescent material is mainly $K_2TiF_6:Mn^{4+}$, and the green conversion fluorescent material is mainly $CsPb(Br/I)_3$.

7. The fabrication method of an integrated Micro LED chip according to claim 1, further comprising:

controlling a light intensity of the blue light-emitting unit in different regions according to a current input by a drive module.

* * * * *